(12) United States Patent
Kinpara et al.

(10) Patent No.: US 10,468,520 B2
(45) Date of Patent: Nov. 5, 2019

(54) SWITCHING ELEMENT AND METHOD OF MANUFACTURING THE SAME

(71) Applicant: TOYOTA JIDOSHA KABUSHIKI KAISHA, Toyota-shi, Aichi (JP)

(72) Inventors: Hiromichi Kinpara, Seto (JP); Yusuke Yamashita, Nagakute (JP); Kensaku Yamamoto, Kariya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/126,220

(22) Filed: Sep. 10, 2018

(65) Prior Publication Data

US 2019/0123192 A1 Apr. 25, 2019

(30) Foreign Application Priority Data

Oct. 19, 2017 (JP) .................................. 2017-202897

(51) Int. Cl.
*H01L 29/76* (2006.01)
*H01L 29/94* (2006.01)
(Continued)

(52) U.S. Cl.
CPC ........ *H01L 29/7813* (2013.01); *H01L 21/047* (2013.01); *H01L 21/0465* (2013.01); *H01L 21/266* (2013.01); *H01L 21/26513* (2013.01); *H01L 21/26586* (2013.01); *H01L 29/045* (2013.01); *H01L 29/0623* (2013.01); *H01L 29/0696* (2013.01); *H01L 29/1045* (2013.01); *H01L 29/4236* (2013.01); *H01L 29/42368* (2013.01); *H01L 29/42376* (2013.01); *H01L 29/66068* (2013.01); *H01L 29/66348* (2013.01); *H01L 29/66734* (2013.01); *H01L 29/7397* (2013.01); *H01L 29/1095* (2013.01)

(58) Field of Classification Search
CPC ............ H01L 29/7813; H01L 29/4236; H01L 29/7827; H01L 29/1095; H01L 29/66666; H01L 29/7397; H01L 29/0696; H01L 27/10876; H01L 29/66348; H01L 29/7802; H01L 27/10823; H01L 29/66712
USPC ...................................................... 257/330
See application file for complete search history.

(56) References Cited

U.S. PATENT DOCUMENTS 10,157,986 B2 * 12/2018 Tanaka ................ H01L 21/0465
2015/0171175 A1 6/2015 Takaya et al.
2016/0211334 A1 * 7/2016 Tanaka .............. H01L 29/66068

FOREIGN PATENT DOCUMENTS

JP 2015-118966 A 6/2015

\* cited by examiner

*Primary Examiner* — Theresa T Doan
(74) *Attorney, Agent, or Firm* — Oliff PLC (57) ABSTRACT

A switching element may include a semiconductor substrate, a trench, a gate insulating film, and a gate electrode. A drift region may be in contact with the gate insulating film below the body region. A bottom region may be in contact with the gate insulating film at a bottom surface of the trench. A connection region may be in contact with the gate insulating film at a side surface of the trench and connect the body region and the bottom region. The side surface of the trench may include a first side surface and a second side surface positioned below the first side surface. An inclination angle of the second side surface may be larger than an inclination angle of the first side surface. An interface between the body region and the drift region may be in contact with the gate insulating film at the first side surface.

7 Claims, 8 Drawing Sheets

(51) Int. Cl.
*H01L 29/78* (2006.01)
*H01L 21/04* (2006.01)
*H01L 21/265* (2006.01)
*H01L 21/266* (2006.01)
*H01L 29/06* (2006.01)
*H01L 29/10* (2006.01)
*H01L 29/423* (2006.01)
*H01L 29/66* (2006.01)
*H01L 29/739* (2006.01)
*H01L 29/04* (2006.01)

SWITCHING ELEMENT AND METHOD OF MANUFACTURING THE SAME

CROSS-REFERENCE TO RELATED APPLICATION

This application claims priority to Japanese Patent Application No. 2017-202897, filed on Oct. 19, 2017, the entire contents of which are incorporated herein by reference.

TECHNICAL FIELD

The disclosure herewith relates to a switching element and a method of manufacturing the same.

BACKGROUND

Japanese Patent Application Publication No, 2015-118966 describes a switching element provided with a semiconductor substrate, a trench, a gate insulating film, and a gate electrode. The trench is provided in an upper surface of the semiconductor substrate. The gate insulating film covers an inner surface of the trench. The gate electrode is disposed in the trench, and is insulated from the semiconductor substrate by the gate insulating film. In this switching element, the semiconductor substrate includes a source region, a body region, a drift region, a bottom region, and a connection region. The source region is an n-type region disposed at the upper surface of the semiconductor substrate and in contact with the gate insulating film. The body region is a p-type region in contact with the gate insulating film below the source region. The drift region is an n-type region in contact with the gate insulating film below the body region and is separated from the source region by the body region. The bottom region is a p-type region in contact with the gate insulating film at a bottom surface of the trench. The connection region is a p-type region in contact with the gate insulating film at a side surface of the trench, and connecting the body region and the bottom region. The drift region is in contact with the gate insulating film in a range where the connection region does not exist.

When this switching element is turned off, a depletion layer spreads from each of the body region and the bottom region into the drift region. The depletion layer spreading from the bottom region suppresses an electric field accumulation in a periphery of a bottom surface of the gate insulating film.

When this switching element is turned on, the switching element shifts to an on-state by a channel being generated in the body region and the depletion layer, which has been spreading in the drift region, contracting. In this process, holes are supplied from the body region to the bottom region through the connection region. As a result, the depletion layer that has been spreading in the drift region from the bottom region contracts toward the bottom region. Due to this, resistance of the drift region can be reduced.

SUMMARY

When an impurity concentration of a connection region is low, the connection region is depleted as a switching element is turned off. When the switching element is turned on, a depletion layer in the connection region contracts, by which a bottom region is electrically connected to a body region via the connection region. Then, holes are supplied to the bottom region from the body region through the connection region. Until the holes are supplied to the bottom region, a depletion layer spreads from the bottom region to a drift region, so a current passage is restricted by the depletion layer spreading in the drift region. Due to this, on-resistance immediately after the turn-on of the switching element is high. Thus, the impurity concentration of the connection region is preferably high in order to reduce the on-resistance immediately after the turn-on of the switching element.

In order to increase the impurity concentration of the connection region, it is considered to make an inclination angle of a side surface of a trench (angle of the side surface of the trench relative to a vertical line to an upper surface of a semiconductor substrate) large to allow p-type impurities to be easily implanted to the side surface of the trench. However, when the inclination angle of the trench is made large, channel mobility becomes low. Thus, the on-resistance increases.

In view of the above circumstance, the disclosure herein provides a technique that can suitably reduce on-resistance of a switching element.

A switching element disclosed herein may comprise: a semiconductor substrate; a trench; a gate insulating film; and a gate electrode. The trench may be provided in an upper surface of the semiconductor substrate. The gate insulating film may cover an inner surface of the trench. The gate electrode may be disposed in the trench and insulated from the semiconductor substrate by the gate insulating film. The semiconductor substrate may comprise: a source region; a body region; a drift region; a bottom region; and a connection region. The source region may be a first conductivity-type region which is disposed at the upper surface of the semiconductor substrate and in contact with the gate insulating film. The body region may be a second conductivity-type region which is in contact with the gate insulating film below the source region. The drift region may be a first conductivity-type region which is in contact with the gate insulating film below the body region and separated from the source region by the body region. The bottom region may be a second conductivity type region which is in contact with the gate insulating film at a bottom surface of the trench. The connection region may be a second conductivity-type region which is in contact with the gate insulating film at a side surface of the trench and connects the body region and the bottom region. The side surface of the trench may be inclined such that a width of the trench increases from a lower side to an upper side of the trench. The side surface of the trench may include a first side surface and a second side surface positioned below the first side surface. An inclination angle of the second side surface may be larger than an inclination angle of the first side surface. An interface between the body region and the drift region may be in contact with the gate insulating film at the first side surface.

In the disclosure herein, one of the first conductivity-type and the second conductivity-type refers to an n-type, and the other thereof refers to a p-type.

When the switching element is turned on, a channel is generated in the body region in a vicinity of the gate insulating film. In this switching element, the interface between the body region and the drift region is in contact with the gate insulating film at the first side surface. Thus, when this switching element is turned on, the channel is generated in the body region in a range corresponding to the first side surface. Since the channel is generated in the range corresponding to the first side surface having a small inclination angle, the channel mobility is high. Due to this, this switching element has low on-resistance.

Further, the second side surface has the larger inclination angle than the first side surface. Due to this, upon forming the connection region, an impurity concentration of the connection region can be made high. Thus, in this switching element, the connection region is less likely to be depleted when the switching element is turned off. Due to this, this switching element has low on-resistance immediately after its turn-on.

A method of manufacturing a switching element disclosed herein may comprise: forming a trench; forming a bottom region; forming a connection region; forming a gate insulating film; and forming a gate electrode. A semiconductor substrate may include a first conductivity-type drift region, a second conductivity-type body region disposed on the drift region, and a first conductivity-type source region disposed on the body region. In the forming of a trench, a trench penetrating the source region and the body region and reaching the drift region may be formed in an upper surface of a semiconductor substrate. In the forming of a bottom region, a second conductivity-type bottom region disposed at a bottom surface of the trench may be formed in the semiconductor substrate. In the forming of a connection region, a connection region connecting the body region and the bottom region may be formed in the semiconductor substrate by implanting second conductivity type impurities into a side surface of the trench. In the forming of a gate insulating film, a gate insulating film covering an inner surface of the trench may be formed. In the forming of a gate electrode, a gate electrode disposed in the trench and insulated from the semiconductor substrate by the gate insulating film may be formed. The trench may be formed so as to satisfy following conditions: a width of the trench increases from a lower side to an upper side of the trench; the side surface of the trench includes a first side surface and a second side surface positioned below the first side surface; an inclination angle of the second side surface is larger than an inclination angle of the first side surface; and an interface between the body region and the drift region is disposed at the first side surface.

When the switching element is turned on, a channel is generated in the body region in a vicinity of the gate insulating film. In the switching element manufactured by this manufacturing method, the interface between the body region and the drift region is in contact with the gate insulating film at the first side surface. Thus, when this switching element is turned on, the channel is generated in the body region in the range corresponding to the first side surface. The channel mobility is high since the channel is generated in the range corresponding to the first side surface having the small inclination angle. Due to this, the switching element manufactured by this manufacturing method has the low on-resistance.

Further, in the above manufacturing method, the trench is formed such that the side surface of the trench includes the first side surface and the second side surface positioned below the first side surface. In doing so, since the inclination angle of the second side surface is formed to be larger than the inclination angle of the first side surface, impurities can be implanted at a greater amount in a semiconductor region in a range exposed at the second side surface. Since the connection region is formed primarily by implanting second conductivity-type impurities to the semiconductor region in the range exposed to the second side surface, the impurity concentration of the connection region can be made high. Thus, in the switching element manufactured by this manufacturing method, the connection region is less likely to be depleted when the switching element is turned off, and the on-resistance of the switching element immediately after its turn-on is low.

The first conductivity-type source region may be formed after the forming of the trench. That is, in the forming of the trench, the trench may be formed in the upper surface of the semiconductor substrate including the first conductivity-type drift region and the second conductivity-type body region disposed on the drift region such that the trench penetrates the body region and reaches the drift region. After this, the first conductivity-type source region disposed on the body region may be formed. In this case, there is no limitation regarding which one of the forming of the bottom region and the forming of the source region is to be carried out first, and which one of the forming of the connection region and the forming of the source region is to be carried out first.

Further, the bottom region may be formed after the connection region. That is, the forming of the bottom region may be carried out after the forming of the connection region. In this case, in the forming of the connection region, the connection region extending from the body region to a region that is to be the bottom region may be formed inside the semiconductor substrate by implanting the second conductivity-type impurities to the side surface of the trench. Then, in the forming of the bottom region, the second conductivity-type bottom region disposed at the bottom surface of the trench and being in contact with the connection region may be formed inside the semiconductor substrate.

DETAILED DESCRIPTION

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide an improved switching element, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

First Embodiment

Figure 1:
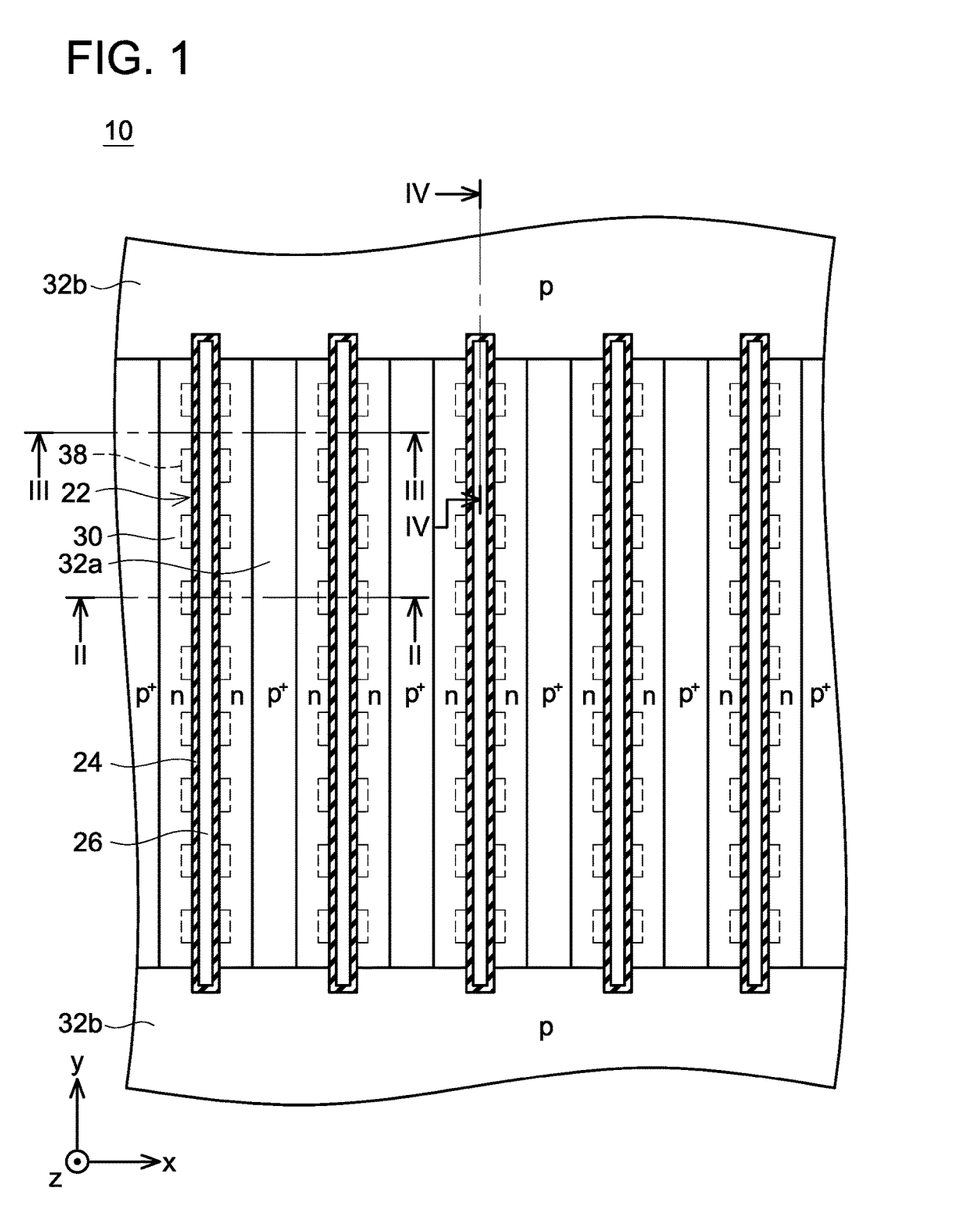
FIG. 1 is a top view of a MOSFET 10 of a first embodiment.

FIGS. 1 to 4 show a MOSFET (Metal-Oxide Semiconductor Field-Effect Transistor) 10 of a first embodiment. The MOSFET 10 includes a semiconductor substrate 12, electrodes, insulating layers, and the like. In FIG. 1, depiction of an electrode and insulating layers on an upper surface 12a of the semiconductor substrate 12 is omitted for easier view. Hereinbelow, one direction parallel to the upper surface 12a of the semiconductor substrate 12 will be termed an x direction, a direction parallel to the upper surface 12a and perpendicularly intersecting the x direction will be termed a y direction, and a thickness direction of the semiconductor substrate 12 will be termed a z direction. The semiconductor substrate 12 is constituted, for example, of SiC (silicon carbide). However, the semiconductor substrate 12 may be constituted of other semiconductor material such as Si (silicon).

Figure 2:
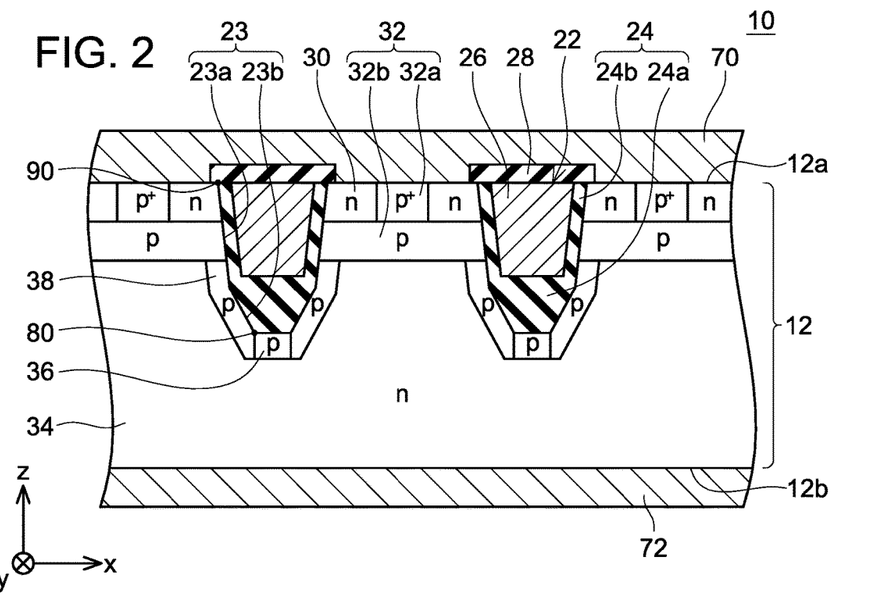
FIG. 2 is a cross-sectional view of the MOSFET 10 along a line II-II of FIG. 1.
Figure 3:
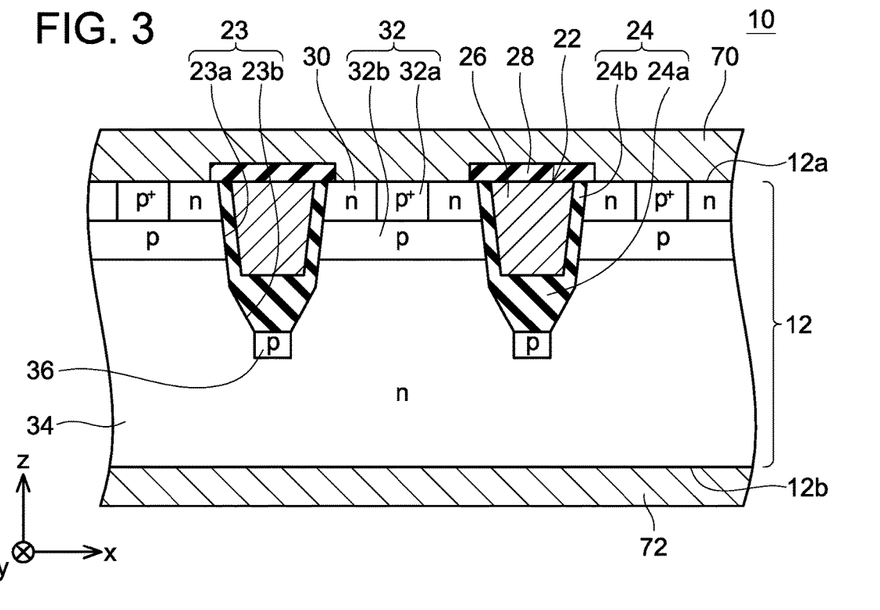
FIG. 3 is a cross-sectional view of the MOSFET 10 along a line III-III of FIG. 1.
Figure 4:
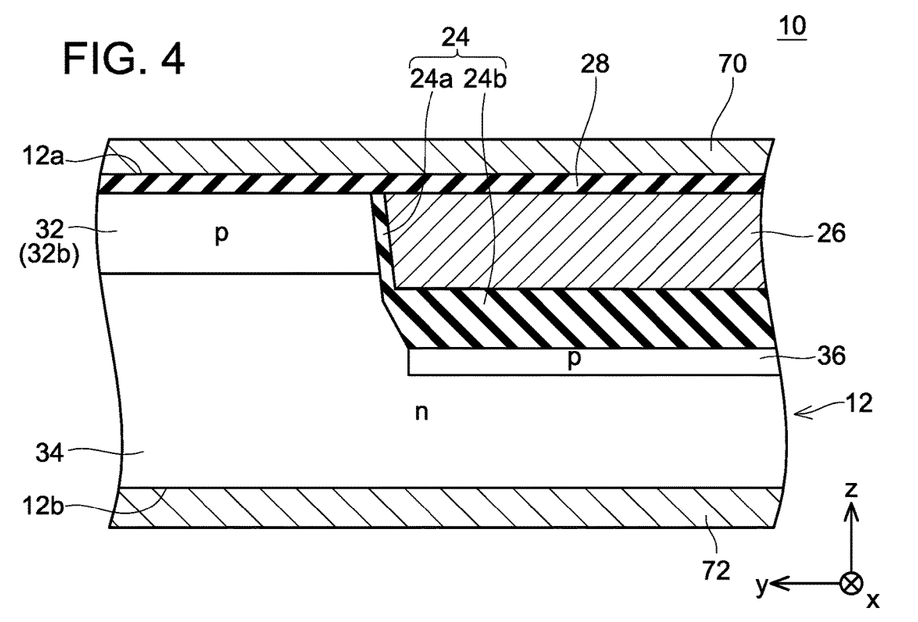
FIG. 4 is a cross-sectional view of the MOSFET 10 along a line IV-IV of FIG. 1.

As shown in FIGS. 2 to 4, a plurality of trenches 22 is provided in the upper surface 12a of the semiconductor substrate 12. As shown in FIG. 1, each of the trenches 22 extends linearly in the y direction. The plurality of trenches 22 is arranged along the x direction with intervals between them. As shown in FIGS. 2 to 4, an inner surface of each trench 22 is covered by a gate insulating film 24. Each gate insulating film 24 includes a bottom insulating film 24a and a side surface insulating film 24b. Each bottom insulating film 24a is provided at a bottom of its corresponding trench 22. Each bottom insulating film 24a covers a bottom surface of its corresponding trench 22 and a side surface in a vicinity of the bottom surface. Each side surface insulating film 24b covers the side surface of its corresponding trench 22 above the bottom insulating film 24a. A thickness of each bottom insulating film 24a (i.e., a width between an upper surface and a lower surface of the bottom insulating film 24a (which is, in other words, a space between a lower end of a gate electrode 26 and the bottom surface of the trench 22)) is thicker than a thickness of each side surface insulating film 24b (i.e., a space between the side surface of the trench 22 and a side surface of the gate electrode 26). A gate electrode 26 is disposed in each trench 22. Each gate electrode 26 is insulated from the semiconductor substrate 12 by its corresponding gate insulating film 24. An upper surface of each gate electrode 26 is covered by an interlayer insulating film 28.

An upper electrode 70 is disposed on the upper surface 12a of the semiconductor substrate 12. The upper electrode 70 is in contact with the upper surface 12a of the semiconductor substrate 12 at a portion where the interlayer insulating films 28 are not provided. The upper electrode 70 is insulated from the gate electrodes 26 by the interlayer insulating films 28. A lower electrode 72 is disposed on a lower surface 12b of the semiconductor substrate 12. The lower electrode 72 is in contact with the lower surface 12b of the semiconductor substrate 12.

As shown in FIGS. 2 to 4, a plurality of source regions 30, a body region 32, a drift region 34, a plurality of bottom regions 36, and a plurality of connection regions 38 are provided within the semiconductor substrate 12.

Each of the source regions 30 is an n-type region. Each of the source regions 30 is arranged at a position disposed at the upper surface 12a of the semiconductor substrate 12. Each of the source regions 30 is in ohmic contact with the upper electrode 70. Further, each of the source regions 30 is in contact with its corresponding side surface insulating film 24b at short-direction side surfaces 23 of the trench 22 (which are side surfaces located at ends of the trench along its short direction and extending in the y direction). Each of the source regions 30 is in contact with its corresponding side surface insulating film 24b at an upper end portion of the trench 22.

The body region 32 is a p-type region. The body region 32 is in contact with each of the source regions 30. The body region 32 extends from each range interposed between two of the source regions 30 to underneath of the respective source regions 30. The body region 32 includes high-concentration regions 32a and a low-concentration region 32b. The high-concentration regions 32a have a higher p-type impurity concentration than the low-concentration region 32b. Each of the high-concentration regions 32a is arranged in the range interposed between the two source regions 30. The high-concentration regions 32a are in ohmic contact with the upper electrode 70. The low-concentration region 32b is in contact with the side surface insulating films 24b at the short-direction side surfaces 23 of the trenches 22. That is, the low concentration region 32b is in contact with the side surface insulating films 24b below the source regions 30. Further, as shown in FIGS. 1 and 4, the low-concentration region 32b is also arranged in ranges adjacent to long-direction side surfaces of the trenches 22 (which are side surfaces located at ends of the trenches along their long direction, and extending in the x direction). The low-concentration region 32b is in contact with the side surface insulating films 24b at the long-direction side surfaces of the trenches 22.

The drift region 34 is an n-type region. The drift region 34 is disposed below the body region 32, and is separated from the source regions 30 by the body region 32. As shown in FIG. 3, the drift region 34 is in contact with the side surface insulating films 24b and the bottom insulating films 24a at the short-direction side surfaces 23 of the trenches 22. That is, the drift region 34 is in contact with the side surface insulating films 24h and the bottom insulating films 24a below the body region 32. Further, the drift region 34 is disposed at the lower surface 12b of the semiconductor substrate 12. The drift region 34 is in ohmic contact with the lower electrode 72.

Each of the bottom regions 36 is a p-type region. As shown in FIG. 1, each of the bottom regions 36 is provided in a range disposed at the bottom surface of its corresponding trench 22. Each of the bottom regions 36 is in contact with its corresponding bottom insulating film 24a at the bottom surface of the trench 22. As shown in FIGS. 2 and 3, a periphery of each bottom region 36 is surrounded by the drift region 34. The bottom regions 36 are separated from the body region 32 by the drift region 34, except at portions where the connection regions 38 (to be described later) are provided.

Each of the connection regions 38 is a p-type region. As shown in FIG. 1, the connection regions 38 are provided along the short-direction side surfaces 23 of the trenches 22. As shown in FIG. 2, the connection regions 38 extend downward from the body region 32 along the short-direction side surfaces 23 of the trenches 22. The connection regions 38 are provided in plurality to the short-direction side surfaces 23 of each trench 22. Lower ends of the connection regions 38 are connected to their corresponding bottom regions 36. That is, the body region 32 and the bottom regions 36 are connected by the connection regions 38.

Each of the short-direction side surfaces 23 of the trenches 22 is inclined such that a width of the trench 22 (its space in the x direction) increases from a lower side to an upper side of the trench 22. Each of the short-direction side surfaces 23 of the trenches 22 includes a first side surface 23a and a second side surface 23b.

As shown in FIGS. 2 and 3, each first side surface 23a extends lower than an interface between the body region 32 and the drift region 34 from an upper end of its corresponding trench 22. That is, the interface between the body region 32 and the drift region 34 is in contact with the gate insulating films 24 (the side surface insulating films 24b) at the first side surfaces 23a. An inclination angle of the first side surfaces 23a is, for example, 4 degrees or smaller.

Each second side surface 23b is connected to its corresponding first side surface 23a. Each second side surface 23b extends from a lower end of the first side surface 23a to a lower end of the trench 22. An inclination angle of the second side surfaces 23b is larger than the inclination angle of the first side surfaces 23a. The inclination angle of the second side surfaces 23b is, for example, 6 degrees or larger. Further, boundaries between the first side surfaces 23a and the second side surfaces 23b are positioned below the lower ends of the gate electrodes 26 (i.e., the upper surfaces of the bottom insulating films 24a). Further, a distance from upper ends of the second side surfaces 23b to lower ends thereof is, for example, one quarter or more of a distance from the interface between the body region 32 and the drift region 34 to the lower ends of the trenches 22.

Next, an operation of the MOSFET 10 will be described. Upon using the MOSFET 10, the MOSFET 10, a load (e.g., a motor), and a power source are connected in series. A power source voltage (which is about 800V in this embodiment) is applied to a series circuit constituted of the MOSFET 10 and the load. The power source voltage is applied in a direction with which a lower electrode 72 side of the MOSFET 10 has a higher potential than an upper electrode 70 side thereof. When an on-potential (potential equal to or higher than a gate threshold) is applied to the gate electrodes 26, channels are generated in the body region 32 (the low-concentration region 32b) in ranges in contact with the side surface insulating films 24b, and the MOSFET 10 is thereby turned on. When an off-potential (potential lower than the gate threshold) is applied to the gate electrodes 26, the channels disappear and the MOSFET 10 is turned off. Hereinbelow, operations of the MOSFET 10 upon its turn-on and turn-off will be described in detail.

In a case of turning off the MOSFET 10, the potential of the gate electrodes 26 is reduced from the on-potential to the off-potential. The channels thereby disappear, and a potential of the lower electrode 72 rises. The potential of the lower electrode 72 rises to a potential which is higher than the potential of the upper electrode 70 by the power source voltage (i.e., about 800V). In this rising process of the potential of the lower electrode 72, a potential of the bottom regions 36 rises slightly by capacitive coupling between the bottom regions 36 and the lower electrode 72. When this happens, holes flow from the bottom regions 36 to the upper electrode 70 through the connection regions 38 and the body region 32. Due to this, the potential rise in the bottom regions 36 is suppressed, and the potential of the bottom regions 36 is maintained at a potential which is slightly higher than the potential of the upper electrode 70.

Further, a potential of the drift region 34 also rises accompanying the potential rise of the lower electrode 72. When the potential of the drift region 34 rises, a potential difference is generated between the body region 32 and the drift region 34. Due to this, a reverse voltage is applied to a pn junction at the interface between the body region 32 and the drift region 34. Thus, a depletion layer spreads from the body region 32 to the drift region 34. Further, when the potential of the drift region 34 rises, a potential difference is generated between the bottom regions 36 and the drift region 34. Due to this, a reverse voltage is applied to pn junctions at interfaces between the bottom regions 36 and the drift region 34. Accordingly, a depletion layer spreads from each of the bottom regions 36 to the drift region 34.

Further, when the potential of the drift region 34 rises, a reverse voltage is also applied to pn junctions at interfaces between the connection regions 38 and the drift region 34. In the MOSFET 10, most parts of the connection regions 38 are in contact with the gate insulating films 24 at the second side surfaces 23b. The second side surfaces 23b have a larger inclination angle than the first side surfaces 23a. Although detailed description will be given later, when the inclination angle of the second side surfaces 23b is larger, a p-type impurity concentration of the connection regions 38 can be set relatively high upon forming the connection regions 38. Due to this, in the process of turning the MOSFET 10 off, depletion layers are less likely to spread from the pn junctions into the connection regions 38. Due to this, the bottom regions 36 can be prevented from being separated from the body region 32 by depletion layers spreading in the connection regions 38.

In a case of turning the MOSFET 10 on, the potential of the gate electrodes 26 is raised from the off-potential to the on-potential. By doing so, electrons are drawn to the body region 32 in ranges in contact with the gate insulating films 24 at the short-direction side surfaces 23 of the trenches 22. Due to this, the body region 32 in these ranges inverts from the p-type to the n-type, and channels are thereby generated. The source regions 30 and the drift region 34 are connected by these channels. Due to this, the potentials of the drift region 34 and the lower electrode 72 drop. When the potential of the drift region 34 drops, the inverse voltage applied to the pn junction at the interface between the body region 32 and the drift region 34 drops. Due to this, the depletion layer that has been spreading from the body region 32 to the drift region 34 contracts toward the body region 32 and disappears. Due to this, electrons start flowing from the upper electrode 70 to the lower electrode 72 through the source regions 30, the channels, and the drift region 34. That is, the MOSFET 10 is turned on.

In the MOSFET 10, the interface between the body region 32 and the drift region 34 is in contact with the gate insulating films 24 at the first side surfaces 23a of the trenches 22. Thus, when the MOSFET 10 is turned on, channels are generated in the body region 32 in ranges corresponding to the first side surfaces 23a. The inclination angle of the first side surfaces 23a is smaller than the inclination angle of the second side surfaces 23b. In general, channel mobility depends on an inclination angle of a side surface where a channel is generated. The channel mobility becomes lower with a larger inclination angle of the side surface. In the MOSFET 10, the channel mobility is high since the channels are generated in the ranges of the first side surfaces 23a having the smaller inclination angle. As such, on-resistance of the MOSFET 10 is low.

Further, in the process of the potential drop in the drift region 34, holes flow from the upper electrode 70 to the bottom regions 36 through the body region 32 and the connection regions 38. When the holes are supplied to the bottom regions 36, the depletion layers that have been spreading from the bottom regions 36 to the drift region 34 contract toward the bottom regions 36 and disappear. In the MOSFET 10, the connection regions 38 are less likely to be depleted upon the turn-off of the MOSFET 10, so the holes are supplied to the bottom regions 36 immediately after the turn-on. Due to this, the depletion layers that have been spreading from the bottom regions 36 to the drift region 34 contract fast. Thus, resistance of the drift region 34 decreases promptly, thereby electrons can easily flow from the upper electrode 70 toward the lower electrode 72. Due to this, in the MOSFET 10, on-resistance immediately after the turn-on is low.

As described above, in the MOSFET 10 of the present embodiment, the channels are generated in the body region 32 in the ranges corresponding to the first side surfaces 23a with the small inclination angle, so the channel mobility is high. Further, upon the turn-off of the MOSFET 10, the connection regions 38 are less likely to be depleted. Thus, the holes are promptly supplied to the bottom regions 36 upon the turn-on of the MOSFET 10. As a result, a current passage is less likely to be restricted by the depletion layers spreading from the bottom regions 36 to the drift region 34. As above, the on-resistance of the MOSFET 10 is low.

Figure 5:
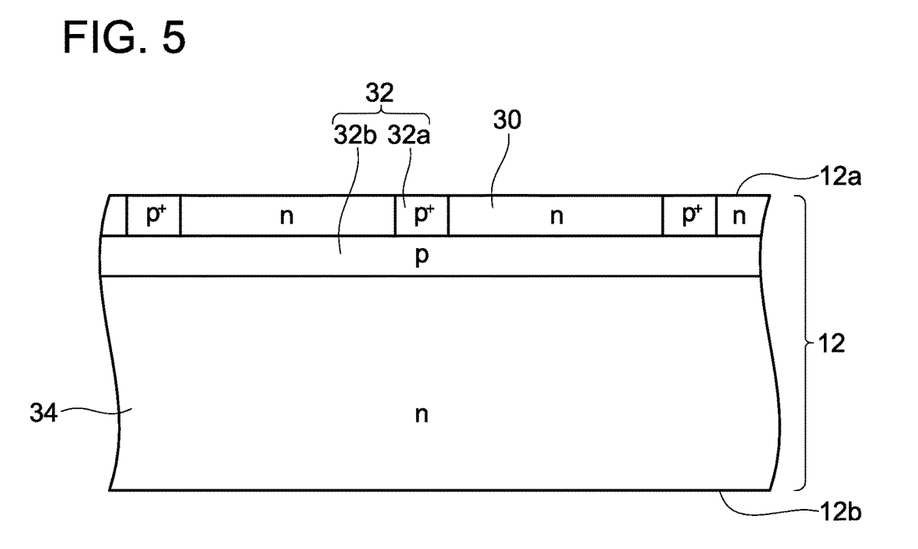
FIG. 5 is a diagram for explaining a manufacturing process of the MOSFET 10 of the first embodiment.

Next, a manufacturing method of the MOSFET 10 will be described. As shown in FIG. 5, firstly, the semiconductor substrate 12 including the n-type drift region 34, the p-type body region 32 disposed on the drift region 34, and the n-type source regions 30 disposed on the body region 32 is prepared. The body region 32 and the source regions 30 may be formed by conventionally known methods such as ion implantation and epitaxial growth.

Figure 6:
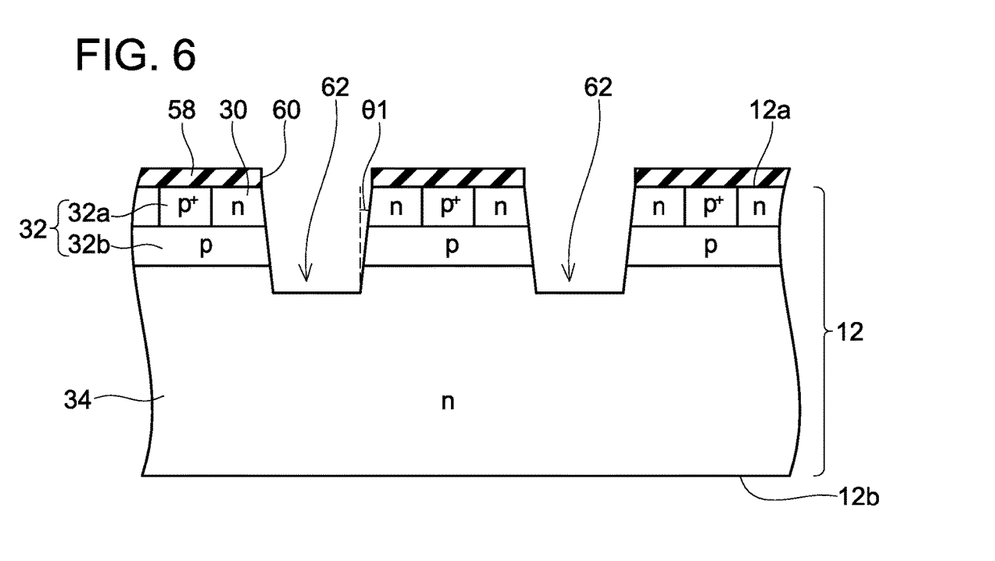
FIG. 6 is a diagram for explaining the manufacturing process of the MOSFET 10 of the first embodiment.

Next, as shown in FIG. 6, a mask 58 including openings 60 at upper surfaces of the source regions 30 is formed. Next, recesses 62, which extend in a depth direction of the semiconductor substrate 12 from the upper surface 12a of the semiconductor substrate 12 that is exposed within the openings 60 of the mask 58, are formed by using dry etching. Side surfaces of the recesses 62 are inclined relative to a vertical line to the upper surface 12a of the semiconductor substrate 12. Due to this, a width of each recess 62 increases from a lower side toward an upper side thereof. The recesses 62 are formed to penetrate the source regions 30 and the body region 32, and reach the drift region 34. Thus, the interface between the body region 32 and the drift region 34 is disposed at the side surfaces of the recesses 62. An inclination angle θ1 of the recesses 62 is, for example, 4 degrees or smaller. The inclination angle θ1 of the recesses 62 can be controlled by adjusting an etching gas pressure during the dry etching, a voltage applied to ions used in the etching, and/or deposition conditions of byproducts generated by the etching (e.g., greater deposition amount with a higher carbon content in gas). Specifically, the inclination angle θ1 can be controlled to be smaller with a lower etching gas pressure, a higher voltage applied to ions, and a condition resulting in a smaller amount of generated byproducts.

Figure 7:
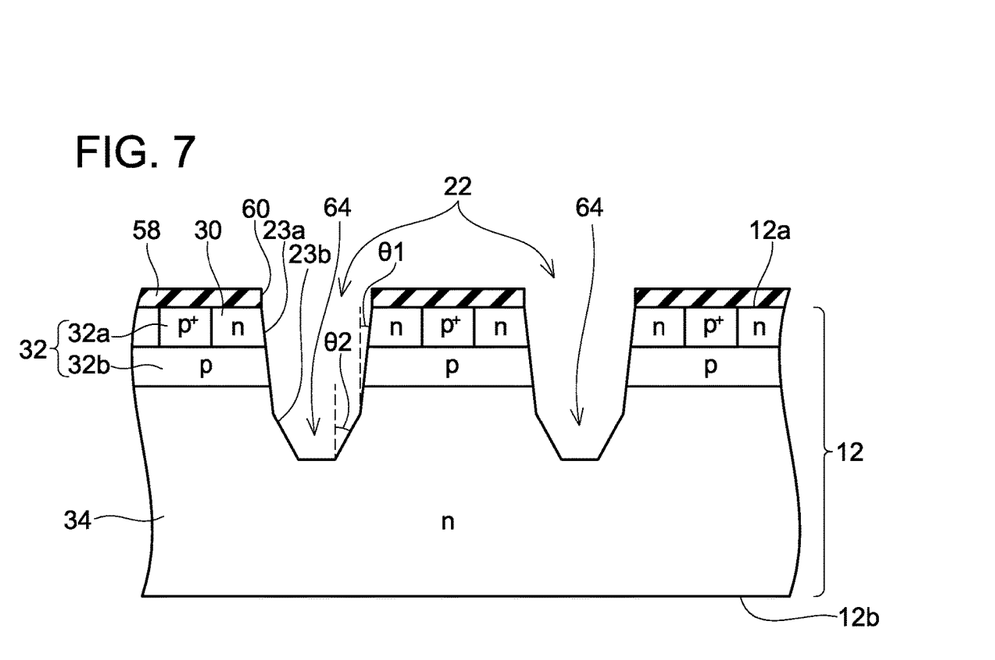
FIG. 7 is a diagram for explaining the manufacturing process of the MOSFET 10 of the first embodiment.

Next, as shown in FIG. 7, bottom surfaces of the recesses 62 formed within the openings 60 of the mask 58 are dry-etched to form recesses 64 that extend further in the depth direction from the bottom surfaces of the recesses 62. Side surfaces of the recesses 64 are inclined relative to the vertical line to the upper surface 12a of the semiconductor substrate 12. Due to this, a width of each recess 64 increases from a lower side toward an upper side thereof. An inclination angle θ2 of the recesses 64 is set larger than the inclination angle θ1 of the recesses 62. The inclination angle θ2 of the recesses 64 is, for example, 6 degrees or larger. The dry etching for forming the recesses 64 is carried out under a condition by which the inclination angle θ2 can be controlled to become larger as compared to the etching condition for forming the recesses 62. Due to this, the trenches 22, which include the first side surfaces 23a (the side surfaces of the recesses 62) and the second side surfaces 23b (the side surfaces of the recesses 64) positioned below the first side surfaces 23a, are formed.

Figure 8:
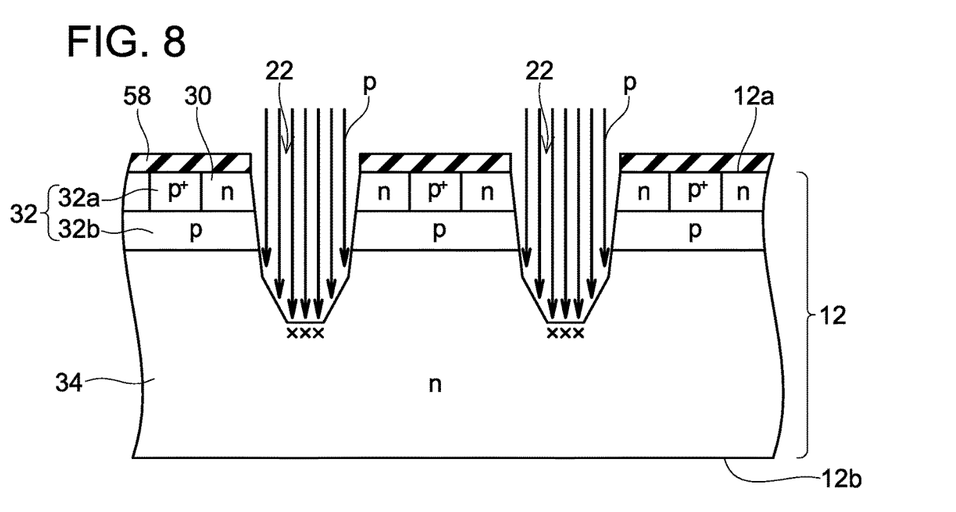
FIG. 8 is a diagram for explaining the manufacturing process of the MOSFET 10 of the first embodiment.

Next, as shown in FIG. 8, p-type impurities are irradiated toward the semiconductor substrate 12 from an upper surface 12a side at a substantially right angle relative to the upper surface 12a, in a state where the mask 58 exists. In a range where the mask 58 is provided, the p-type impurities are implanted in the mask 58, so the p-type impurities are not implanted in the semiconductor region located beneath the mask 58. Further, since an angle between the short-direction side surfaces 23 of the trenches 22 and an impurity irradiating direction is small, the p-type impurities are less likely to be implanted in the side surfaces 23. Thus, the p-type impurities are mainly implanted in the bottom surfaces of the trenches 22.

Figure 9:
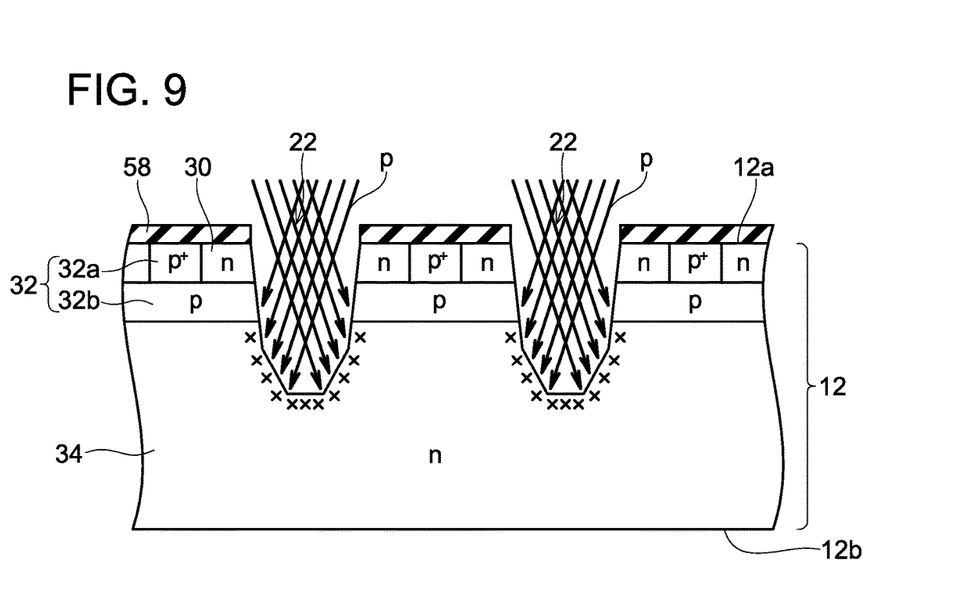
FIG. 9 is a diagram for explaining the manufacturing process of the MOSFET 10 of the first embodiment.

Next, as shown in FIG. 9, the p-type impurities are irradiated toward the semiconductor substrate 12 from the upper surface 12a side at an angle inclined relative to the vertical line to the upper surface 12a of the semiconductor substrate 12, in the state where the mask 58 exists. Since the p-type impurities irradiation angle is inclined, the p-type impurities are implanted in the short-direction side surfaces 23 of the trenches 22. Further, the inclination angle θ2 of the second side surfaces 23b is larger than the inclination angle θ1 of the first side surfaces 23a. Due to this, the p-type impurities are implanted in the second side surfaces 23b at a greater amount as compared to the first side surfaces 23a. Thus, a p-type impurity concentration of the ranges exposed at the second side surfaces 23b becomes high. The p-type impurity implantation is carried out plural times with different orientations of the semiconductor substrate 12, so the p-type impurities are implanted to both side surfaces 23 of each trench 22. A concentration of the p-type impurities implanted to the source regions 30 is much lower than an n-type impurity concentration of the source regions 30.

Figure 10:
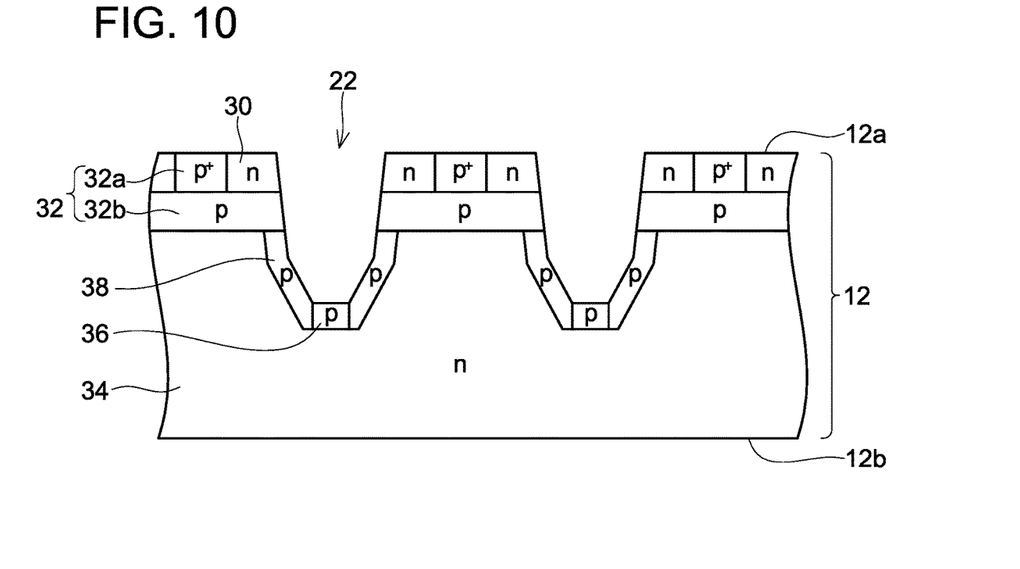
FIG. 10 is a diagram for explaining the manufacturing process of the MOSFET 10 of the first embodiment.

Next, the p-type impurities implanted in the semiconductor substrate 12 are activated by subjecting the semiconductor substrate 12 to thermal treatment. By activating the p-type impurities implanted in the bottom surfaces of the trenches 22 (see FIG. 8), the bottom regions 36 are formed in the ranges exposed at the bottom surfaces of the trenches 22 as shown in FIG. 10. Further, by activating the p-type impurities implanted in the side surfaces 23 of the trenches 22 (see FIG. 9), the connection regions 38 are formed in the ranges exposed at the side surfaces 23 of the trenches 22 as shown in FIG. 10. Due to this, the body region 32 and the bottom regions 36 are connected by the connection regions 38.

Figure 11:
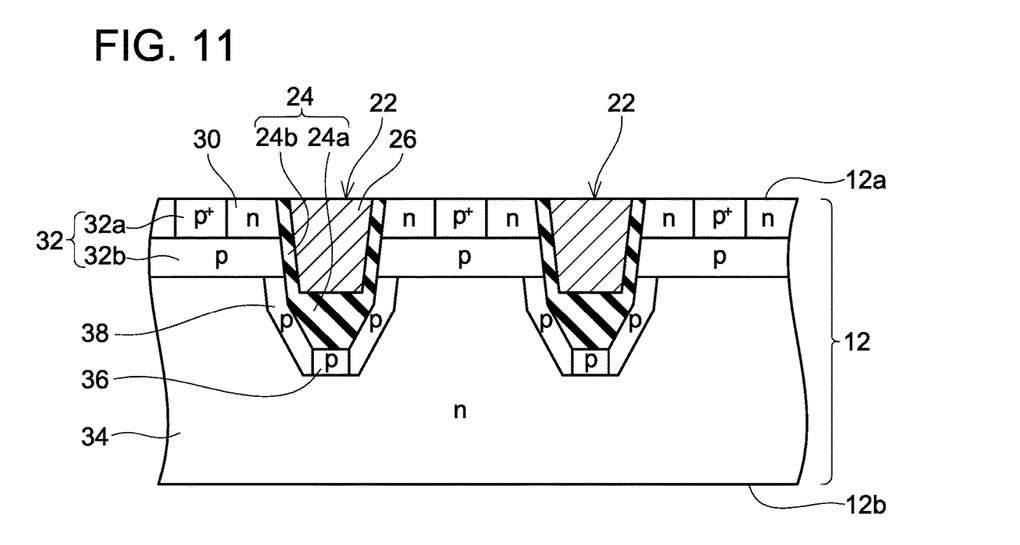
FIG. 11 is a diagram for explaining the manufacturing process of the MOSFET 10 of the first embodiment.

Next, as shown in FIG. 11, the bottom insulating films 24a are formed on the bottom surfaces of the trenches 22. Next, the side surface insulating films 24b are formed so as to cover the side surfaces of the trenches 22 above the bottom insulating films 24a. Next, the gate electrodes 26 are formed in the trenches 22 after the bottom insulating films 24a and the side surface insulating films 24b have been formed. The gate electrodes 26 are formed so as to be insulated from the semiconductor substrate 12 by the bottom insulating films 24a and the side surface insulating films 24b. Further, the gate electrodes 26 are formed such that lower end portions of the gate electrodes 26 are positioned below the body region 32 in a cross section that does not include the connection regions 38. As shown in FIG. 11, by forming the gate insulating films 24 (i.e., the bottom insulating films 24a and the side surface insulating films 24b) and the gate electrodes 26, the drift region 34 comes to be in contact with the bottom insulating films 24a and the side surface insulating films 24b on the side surfaces of the trenches 22 at positions where the connection regions 38 do not exist. Further, the body region 32 comes to be in contact with the side surface insulating films 24b above the drift region 34. Further, the source regions 30 come to be in contact with the side surface insulating films 24b above the body region 32. Further, the bottom regions 36 come to be in contact with the bottom insulating films 24a at the bottom surfaces of the trenches 22. Further, the connection regions 38 come to be in contact with the side surface insulating films 24b at the side surfaces of the trenches 22.

After this, the interlayer insulating films 28, the upper electrode 70, and the lower electrode 72 are formed, and the MOSFET 10 shown in FIGS. 1 to 4 is thereby completed.

As described above, according to this manufacturing method, the trenches 22 are formed such that the interface between the body region 32 and the drift region 34 is in contact with the gate insulating films 24 at the first side surfaces 23a. Thus, when the MOSFET 10 manufactured by this manufacturing method is to be turned on, channels are generated in the body region 32 in the ranges corresponding to the first side surfaces 23a. Since the channels are generated in the ranges corresponding to the first side surfaces 23a having the small inclination angle, the channel mobility is high. Due to this, the MOSFET 10 manufactured by this manufacturing method has low on-resistance.

Further, in this manufacturing method, in forming the trenches 22, the short-direction side surfaces 23 of the trenches 22 are formed to include the second side surfaces 23b positioned below the first side surfaces 23a. At this occasion, the inclination angle of the second side surfaces 23b is formed to be larger than the inclination angle of the first side surfaces 23a, so the impurities can be implanted in the semiconductor region in the ranges exposed at the second side surfaces 23b at a greater amount. Since the connection regions 38 are formed by implanting the p-type impurities in the semiconductor region mainly in the ranges exposed at the second side surfaces 23b, the impurity concentration of the connection regions 38 can be made high. Thus, the MOSFET 10 manufactured by this manufacturing method includes the connection regions 38 that are less likely to be depleted upon turn-off of the MOSFET 10 and can achieve low on-resistance immediately after the turn-on.

Second Embodiment

Figure 12:
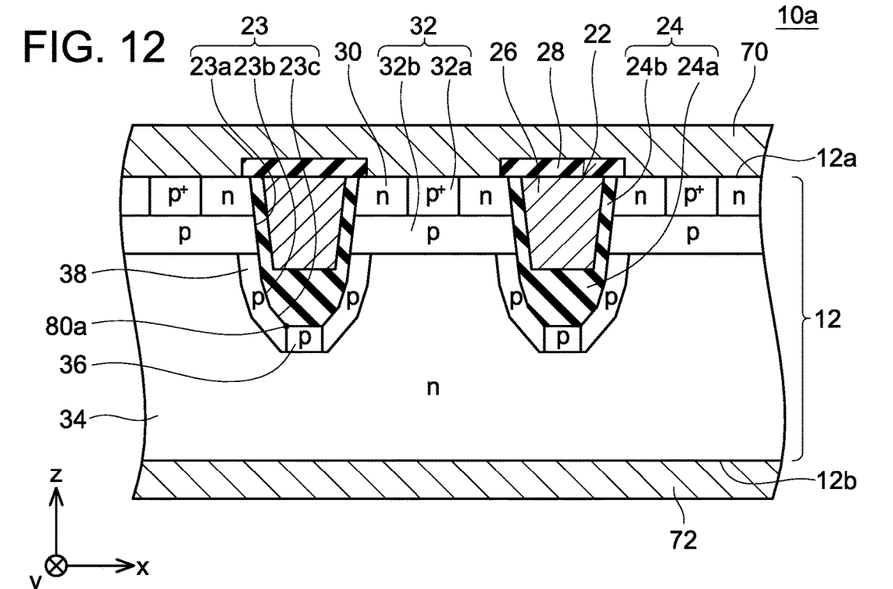
FIG. 12 is a cross-sectional view (corresponding to FIG. 2) of a MOSFET 10a of a second embodiment.

Next, a MOSFET 10a of a second embodiment will be described with reference to FIG. 12. Among configurations of the MOSFET 10a of the second embodiment, descriptions regarding configurations thereof that are in common with the MOSFET 10 of the first embodiment will be omitted. The same applies to a third embodiment to be described later. In the MOSFET 10a of the second embodiment, the configuration of the trenches 22 is different from that of the first embodiment. That is, the short-direction side surfaces 23 of each trench 22 further include third side surfaces 23c.

The third side surfaces 23c are connected to their corresponding second side surfaces 23b. The third side surfaces 23c extend from lower ends of the second side surfaces 23b to the lower ends of the trenches 22. An inclination angle θ3 of the third side surfaces 23c (see FIG. 13) is larger than the inclination angle θ2 of the second side surfaces 23b. The inclination angle θ3 of the third side surfaces 23c is, for example, 20 degrees or larger.

In the MOSFET 10 of the first embodiment, corners 80 (see FIG. 2) formed by the second side surfaces 23b of the trenches 22 and the bottom surfaces of the trenches 22 are relatively acute. Due to this, when the MOSFET 10 is turned off, an electric field accumulation tends to occur in the semiconductor region in vicinities of the corners 80. Contrary to this, in the MOSFET 10a of the second embodiment, an angle of corners 80a formed by the third side surfaces 23c of the trenches 22 and the bottom surfaces of the trenches 22 is larger than an angle of the corners 80 of the first embodiment. Thus, the electric field accumulation occurs less in the semiconductor region in vicinities of the corners 80a. Due to this, the MOSFET 10a has high voltage resistance.

Figure 13:
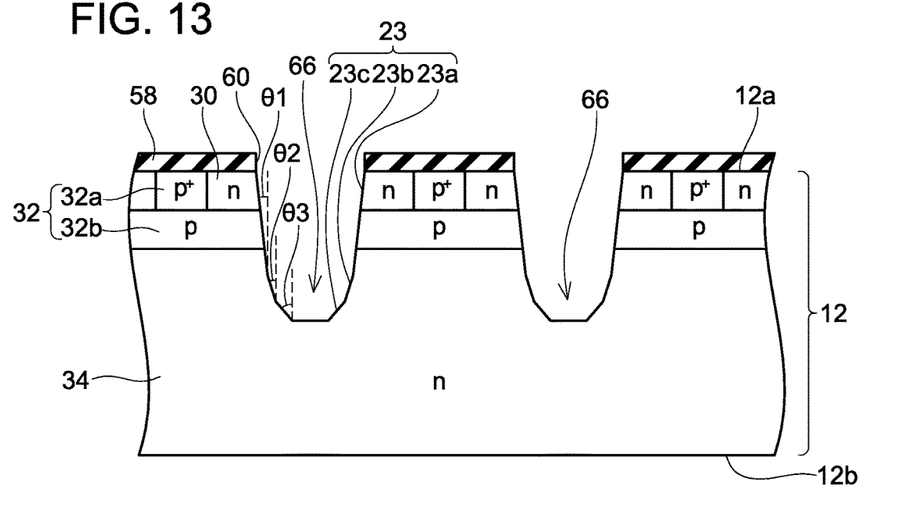
FIG. 13 is a diagram for explaining a manufacturing process of the MOSFET 10a of the second embodiment.

Next, a manufacturing method of the MOSFET 10a of the second embodiment will be described. With the MOSFET 10a of the second embodiment, after the recesses 64 shown in FIG. 7 are formed, recesses 66 that further extend in the depth direction from exposed surfaces of the recesses 64 are formed by dry etching as shown in FIG. 13. Side surfaces of the recesses 66 are inclined relative to the vertical line to the upper surface 12a of the semiconductor substrate 12. Due to this, a width of each recess 66 increases from a lower side toward an upper side thereof. An inclination angle θ3 of the recesses 66 is set larger than the inclination angle θ2 of the recesses 64. The inclination angle θ3 of the recesses 66 is, for example, 20 degrees or larger. The dry etching for forming the recesses 66 is carried out under a condition by which an inclination angle can be controlled to become larger as compared to the etching condition for forming the recesses 64. Due to this, the trenches, which include the first side surfaces 23a (the side surfaces of the recesses 62), the second side surfaces 23b (the side surfaces of the recesses 64) positioned below the first side surfaces 23a, and the third side surfaces 23c (the side surfaces of the recesses 66) positioned below the second side surfaces 23b, are formed. After this, processes similar to those of the first embodiment are carried out and the MOSFET 10a of the second embodiment is thereby completed.

Third Embodiment

Figure 14:
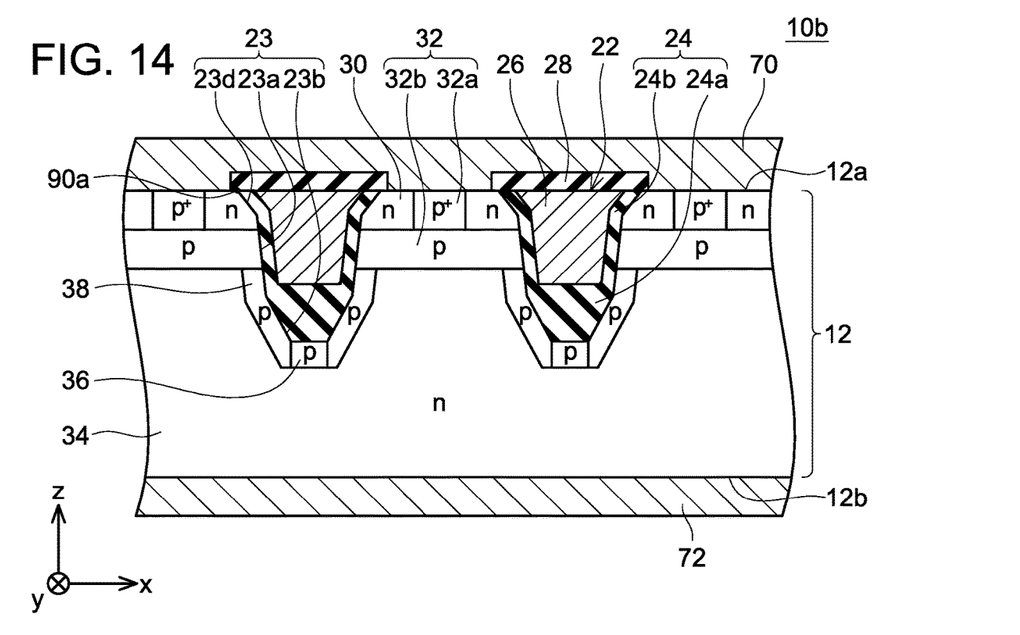
FIG. 14 is a cross-sectional view (corresponding to FIG. 2) of a MOSFET 10b of a third embodiment.

Next, a MOSFET 10b of a third embodiment will be described with reference to FIG. 14. In the MOSFET 10b of the third embodiment, the short-direction side surfaces 23 of each trench 22 further include fourth side surfaces 23d.

The fourth side surfaces 23d are connected to their corresponding first side surfaces 23a. The fourth side surfaces 23d extend from upper ends of the first side surfaces 23a to the upper surface 12a of the semiconductor substrate 12. That is, upper ends of the fourth side surfaces 23d are connected to the upper surface 12a of the semiconductor substrate 12. An inclination angle θ4 of the fourth side surfaces 23d (see FIG. 15) is larger than the inclination angle θ1 of the first side surfaces 23a (see FIGS. 7 and 13). The inclination angle θ4 of the fourth side surfaces 23d is, for example, 20 degrees or larger.

In the MOSFET 10 of the first embodiment, corners 90 (see FIG. 2) formed by the upper surface 12a of the semiconductor substrate 12 and the first side surfaces 23a of the trenches 22 are relatively acute. Due to this, when the MOSFET 10 is turned off, the electric field accumulation tends to occur in the semiconductor region in vicinities of the corners 90. Contrary to this, in the MOSFET 10b of the third embodiment, an angle of corners 90a formed by the upper surface 12a of the semiconductor substrate 12 and the fourth side surfaces 23d of the trenches 22 is larger than an angle of the corners 90 of the first embodiment. Thus, the electric field accumulation occurs less in the semiconductor region in vicinities of the corners 90a. Due to this, the MOSFET 10b has high voltage resistance.

Figure 15:
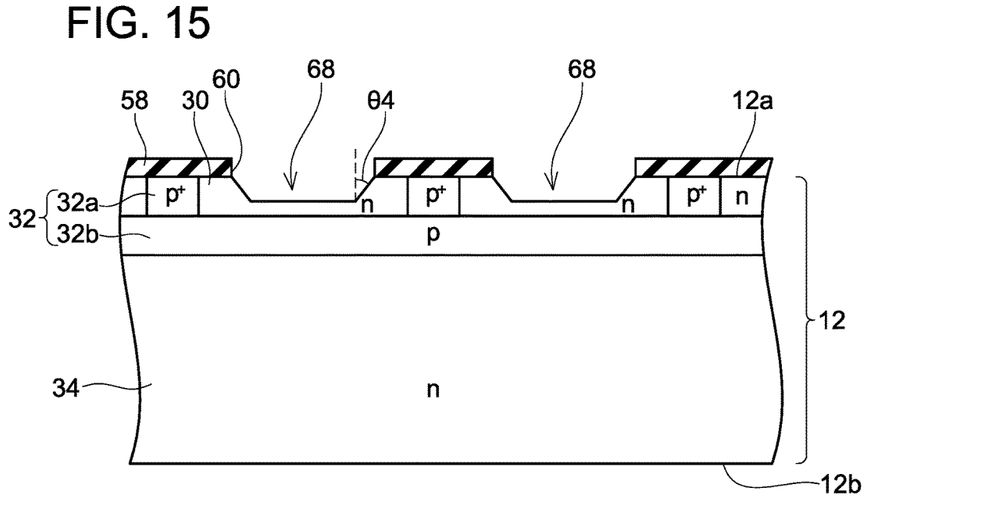
FIG. 15 is a diagram for explaining a manufacturing process of the MOSFET 10b of the third embodiment.

Next, a manufacturing method of the MOSFET 10b of the third embodiment will be described. With the MOSFET 10b of the third embodiment, before the recesses 62 shown in FIG. 6 are formed, recesses 68, which extend in the depth direction from the upper surface 12a of the semiconductor substrate 12 exposed within the openings 60 of the mask 58, are formed by dry etching as shown in FIG. 15. Side surfaces of the recesses 68 are inclined relative to the vertical line to the upper surface 12a of the semiconductor substrate 12. Due to this, a width of each recess 68 increases from a lower side toward an upper side thereof. An inclination angle θ4 of the recesses 68 is set larger than the inclination angle θ1 of the recesses 62 (see FIGS. 6 and 7). The inclination angle θ4 of the recesses 68 is, for example, 20 degrees or larger. Bottom surfaces of the recesses 68 are formed so as to be positioned above interfaces between the source regions 30 and the low-concentration region 32b of the body region 32. At this occasion, the dry etching for forming the recesses 68 is carried out under a condition by which an inclination angle can be controlled to become larger as compared to the etching condition for forming the recesses 62 shown in FIG. 6. After this, processes similar to those of the first embodiment are carried out and the MOSFET 10b of the third embodiment is thereby completed.

The recesses 66 shown in FIG. 13 may be formed after the recesses 64 shown in FIG. 7 have been formed. In this case, the mask 58 is removed after the recesses 64 shown in FIG. 7 have been formed, and a mask having openings whose width is wider than that of the openings 60 of the mask 58 is formed. Then, the recesses 66 can be formed by suitably changing the etching condition.

The side surfaces 23 of the trenches 22 may further include the third side surfaces 23c of the second embodiment.

In the aforementioned embodiments, the connection regions 38 extend downward from the body region 32 along the short-direction side surfaces 23 of the trenches 22. However, the connection regions 38 may extend downward from the body region 32 along the long-direction side surfaces of the trenches 22 to be connected to the bottom regions 36. In this case, the on-resistance can suitably be reduced by providing inclinations to the long-direction side surfaces of the trenches 22 similar to the short-direction side surfaces 23 of the trenches 22 (e.g., the first side surfaces 23a and the second side surfaces 23b).

Further, in the aforementioned embodiments, the connection regions 38 are provided at positions being opposed to each other with the trench 22 between them. However, the connection regions 38 may be provided only on one of the short-direction side surfaces 23 of each trench 22. Further, the connection regions 38 may be provided alternately in the y direction on both short-direction side surfaces 23 of each trench 22.

Further, the short-direction side surfaces 23 of the trenches 22 may further include side surfaces having an inclination angle different from those of the aforementioned side surfaces (the first side surfaces 23a to the fourth side surfaces 23d). Specifically, the short-direction side surfaces 23 of the trenches 22 may further include one or more different side surfaces positioned below the third side surfaces 23c. In this case, the side surfaces 23 of the trenches 22 may include the one or more different side surfaces such that the inclination angle thereof becomes larger as positioned farther below the third side surfaces 23c.

Further, in the aforementioned embodiments, the n-channel type MOSFETs are described, however, the technique disclosed herein may be applied to p-channel type MOSFETs. A p-channel type MOSFET structure may be obtained by inverting the n-type and the p-type in the aforementioned embodiments. Further, in the aforementioned embodiments, the MOSFETs are described, however, the technique disclosed herein may be applied to IGBTs. An IGBT structure may be obtained by interposing a p-type region between the drift region 34 and the lower electrode 72.

Some of the features characteristic to the technology disclosed herein will be listed below. It should be noted that the respective technical elements are independent of one another, and are useful solely or in combinations.

In a configuration disclosed herein as an example, the inclination angle of the first side surface may be 4 degrees or smaller.

In such a configuration, channel mobility can suitably be improved.

In a configuration disclosed herein as an example, the inclination angle of the second side surface may be 6 degrees or larger.

In such a configuration, an impurity concentration of the connection region can suitably be increased upon forming the connection region.

In a configuration disclosed herein as an example, the side surface of the trench may include a third side surface positioned below the second side surface, and an inclination angle of the third side surface may be larger than the inclination angle of the second side surface.

In such a configuration, a corner formed by the third side surface and the bottom surface of the trench is obtuse. Accordingly, an electric field accumulation in the semiconductor region in a vicinity of this corner can be suppressed upon when the switching element is turned off.

In a configuration disclosed herein as an example, the inclination angle of the third side surface may be 20 degrees or larger.

In such a configuration, an electric field applied to the semiconductor region in the vicinity of the corner formed by the third side surface and the bottom surface of the trench can suitably be reduced.

In a configuration disclosed herein as an example, the side surface of the trench may include a fourth side surface positioned above the first side surface, an inclination angle of the fourth side surface may be larger than the inclination angle of the first side surface, and an upper end of the fourth side surface may be connected to the upper surface of the semiconductor substrate.

In such a configuration, a corner formed by the fourth side surface and the upper surface of the semiconductor substrate is obtuse. Accordingly, the electric field accumulation in the semiconductor region in a vicinity of this corner can be suppressed upon when the switching element is turned off.

In a configuration disclosed herein as an example, the inclination angle of the fourth side surface may be 20 degrees or larger.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:

1. A switching element comprising:
    a semiconductor substrate;
    a trench provided in an upper surface of the semiconductor substrate;
    a gate insulating film covering an inner surface of the trench; and
    a gate electrode disposed in the trench and insulated from the semiconductor substrate by the gate insulating film,
    wherein
    the semiconductor substrate comprises:
    a first conductivity-type source region disposed at the upper surface of the semiconductor substrate and being in contact with the gate insulating film;
    a second conductivity-type body region being in contact with the gate insulating film below the source region;
    a first conductivity-type drift region being in contact with the gate insulating film below the body region and separated from the source region by the body region;
    a second conductivity-type bottom region being in contact with the gate insulating film at a bottom surface of the trench; and
    a second conductivity-type connection region being in contact with the gate insulating film at a side surface of the trench and connecting the body region and the bottom region,
    wherein
    the side surface of the trench is inclined such that a width of the trench increases from a lower side to an upper side of the trench,
    the side surface of the trench includes a first side surface and a second side surface positioned below the first side surface,
    an inclination angle of the second side surface is larger than an inclination angle of the first side surface, and
    an interface between the body region and the drift region is in contact with the gate insulating film at the first side surface.

2. The switching element of claim 1, wherein
    the inclination angle of the first side surface is 4 degrees or smaller.

3. The switching element of claim 1, wherein
    the inclination angle of the second side surface is 6 degrees or larger.

4. The switching element of claim 1, wherein
    the side surface of the trench includes a third side surface positioned below the second side surface, and
    an inclination angle of the third side surface is larger than the inclination angle of the second side surface.

5. The switching element of claim 4, wherein
    the inclination angle of the third side surface is 20 degrees or larger.

6. The switching element of claim 1, wherein
    the side surface of the trench includes a fourth side surface positioned above the first side surface,
    an inclination angle of the fourth side surface is larger than the inclination angle of the first side surface, and
    an upper end of the fourth side surface is connected to the upper surface of the semiconductor substrate.

7. The switching element of claim 6, wherein
    the inclination angle of the fourth side surface is 20 degrees or larger.

* * * * *